United States Patent
Aihara

[11] Patent Number: 5,921,559
[45] Date of Patent: Jul. 13, 1999

[54] SEALING STRUCTURE FOR AN AIRTIGHT CHAMBER

[75] Inventor: Masami Aihara, Miyagi-ken, Japan

[73] Assignee: Frontec Incorporated, Sendai, Japan

[21] Appl. No.: 08/829,455

[22] Filed: Mar. 28, 1997

[30] Foreign Application Priority Data

Mar. 31, 1996 [JP] Japan .................................. 8-101982
Mar. 4, 1997 [JP] Japan .................................. 9-049490

[51] Int. Cl.$^6$ .................................................. F16J 15/08
[52] U.S. Cl. ............................ 277/651; 277/941; 118/733
[58] Field of Search .................................. 277/590, 591, 277/595, 592, 627, 628, 641, 642, 940, 941, 939, 651; 118/733; 418/149; 417/571; 123/193.3, 193.5

[56] References Cited

U.S. PATENT DOCUMENTS

| | | | |
|---|---|---|---|
| 4,039,296 | 8/1977 | Levinstein | 277/940 X |
| 4,723,518 | 2/1988 | Kawasaki et al. | 123/193.3 X |
| 5,660,639 | 8/1997 | Wilski et al. | 118/733 X |

FOREIGN PATENT DOCUMENTS

| | | | |
|---|---|---|---|
| 2059219 | 6/1972 | Germany | 123/193.3 |
| 62-72456 | 5/1987 | Japan . | |
| 62-72457 | 5/1987 | Japan . | |
| 62-72458 | 5/1987 | Japan . | |
| 63-24256 | 2/1988 | Japan . | |
| 5-57579 | 7/1993 | Japan . | |
| 6-122950 | 5/1994 | Japan . | |
| 6-145924 | 5/1994 | Japan . | |
| 7-9085 | 1/1995 | Japan . | |
| 7-113459 | 5/1995 | Japan . | |
| 179912 | 7/1962 | Sweden | 123/193.3 |

OTHER PUBLICATIONS

Falbe, Jurgen et al, Rompp Chemie Lexikon, 9th ed., (Stuttgart: Georg Thieme Verlag), p. 2479, 1990.

*Primary Examiner*—Eric K. Nicholson
*Assistant Examiner*—Greg Binda
*Attorney, Agent, or Firm*—Brinks Hofer Gilson & Lione

[57] ABSTRACT

A sealing structure for an airtight chamber includes a first division member and a second division member being repeatedly joined and disjoined. The first and second chamber members are joined together to define the chamber between them and disjoined to allow access to the chamber. The structure also includes a sealing member pressed between the first and second division members to keep the chamber airtight against a pressure difference between the exterior and the interior of the chamber while the first and second division members are joined. The first and second division members are made of a material with hardness lower than that of the sealing member and are formed with a groove. The structure also includes seat members being embedded in the grooves and pressed against the sealing member while the first and second division members are joined. The seat member is made of a material harder than the division member and welded in said groove only along its contacting surfaces with the groove.

9 Claims, 7 Drawing Sheets

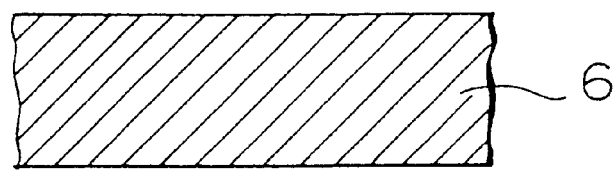
FIG. IA
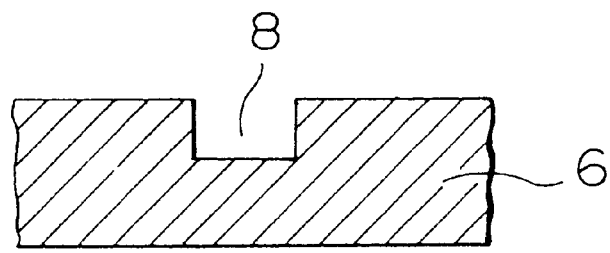
FIG. IB
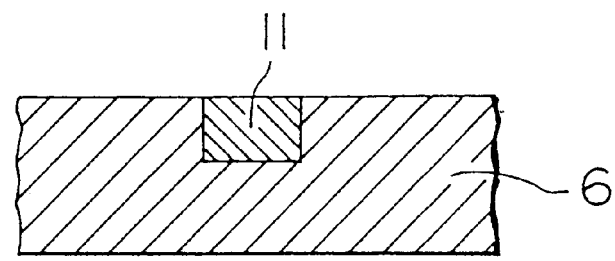
FIG. IC
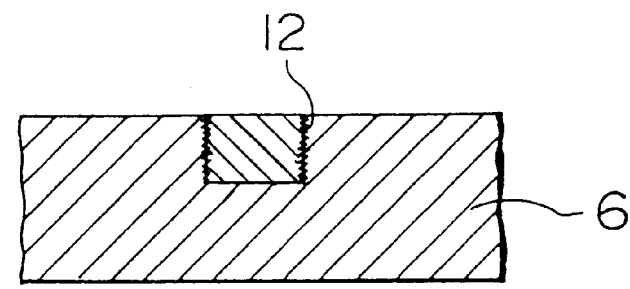
FIG. ID

SEALING STRUCTURE FOR AN AIRTIGHT CHAMBER

BACKGROUND OF THE INVENTION

1. Field of the Invention

The present invention relates to a sealing structure.

2. Description of the Related Art

A conventional sealing structure will be described with reference to a vacuum apparatus. For example, as set forth in FIG. 5, a vacuum apparatus, such as a plasma enhanced CVD system for producing semiconductor devices, is assembled from a plurality of chamber members, e.g. a housing member 3, a cover member 2, a vacuum system member 4 and a flange 5, while sealing these chamber members with O-rings O1, O2 and O3.

The vacuum apparatus set forth in FIG. 5 has three sealing sections S1, S2 and S3. In detail, the housing member 3 and the cover member 2 are sealed with the O-ring O1 at the sealing section S1, the housing member 3 and the vacuum system member 4 are sealed with the O-ring O3 at the sealing section S3, and the cover member 2 and the flange 5 are sealed with the O-ring O2 at the sealing section S2. A vacuum apparatus may be assembled from more chamber members depending on the type and application of the vacuum apparatus, and the number of the sealing sections also varies with this. In FIG. 5, symbol W represents a substrate, symbol EL represents a lower electrode, symbol EU represents an upper electrode provided with a shower box, symbol MFC represents a mass flow controller, symbol M/B represent a matching box, symbol TMP represents a turbo molecular pump and symbol RF represents a high-frequency power source.

Stainless steel has generally been used for chamber members, and aluminum alloys have also been used for reducing weight of the apparatus and improving homogeneity of temperature in the chamber.

Since aluminum alloys have lower hardnesses compared to stainless steel, the O-ring seating face sinks or yields to form a dent when repeatedly used. In particular, such denting is noticeable in low hardness aluminum alloys such as JIS A5052. This denting causes an increased leakage rate of the vacuum apparatus.

An improvement in O-rings has been tried to prevent dent formation and decrease the leakage rate of the vacuum apparatus. The improved O-ring is a SUS304 O-ring (Hv: 200 to 300) coated with pure aluminum (Hv: 30). Although this O-ring somewhat increases the number of repeated cycles until a dent forms, it does not perfectly prevent denting.

Several methods for hardening the surface of the chamber member have been proposed as follows:

(1) The O-ring seating face is coated with a TiN film having a thickness of approximately several dozen μm to increase the hardness of the O-ring seating face.

In this case, since the substrate still has a low hardness, a dent forms on the substrate and the coated film also yields accompanying the dent, resulting in leakage. When using a JIS A5052 material (Hv: 60 to 70), leakage is noticeable. The TiN film is coated at a high temperature of 200 to 250° C. When using an aluminum alloy, of which the hardness is increased by age hardening, for example, JIS A2219-T87 (Hv: 130) as a substrate, the aluminum alloy is softened to a Hv value of 50 to 60 during film coating, and thus a dent forms as in JIS A5052 and thus leakage is inevitable.

(2) FIGS. 7A–7E show another conventional sealing structure. In this conventional sealing structure, a groove 108 is formed in the O-ring seating face 107 as shown in FIG. 7B. A Ni wire 109 is placed in the groove 108 as shown in FIG. 7C. The entire Ni wire 109 is melted and fused in the division member, i.e., a base material 106, by welding as shown in FIG. 7D to form a weld section 110, which is made of an Al—Ni alloy (Hv: 100 to 200). The surface is finished by mechanical working to smooth it as shown in FIG. 7E.

However, it has been found that the surface after finishing occasionally has coarse dimples in this case. It is considered that these dimples form due to the following reason. Oxygen which is present as oxide on the aluminum alloy surface evolves as oxygen bubbles during welding and is trapped in the alloy. The bubbles are released from the matrix during surface finishing but bubble marks still remain on the finished surface as dimples. Such dimples also work as a leakage source. Although bubble marks are not always present on the chamber member, this technology is unsuitable for vacuum apparatuses having many sealing sections, because the degree of vacuum decreases if one of a plurality of vacuum units has a leaking section.

Further, the hardness of the weld section 110 is not uniform and fine cracks due to nonuniform hardness are found. These cracks also work as a leakage source.

SUMMARY OF THE INVENTION

It is an object of the present invention to provide a sealing structure of which the sealing section exhibits excellent sealing characteristics and less fluctuation after repeated use.

In accordance with the present invention, a sealing structure is characterized in that a seat member is embedded into a sealing member seating section at a sealing section of a division member at which on both sides are different pressures, the seat member comprising a material having a hardness higher than a division member material, and the seat member is locally fused to the side face of the division member.

In the present invention, since the seating section of the division member for the sealing member, for example, an O-ring, is composed of a material having a hardness higher than the division member material, no dent forms by repeated use and high sealing performance can be maintained. Further, the division member material is locally fused to the seat member at the side face of the seating section. Therefore, no bubbles are present in the seating section of the sealing member and satisfactory sealing characteristics can be maintained without fluctuation in sealing characteristics of a plurality of sealing sections. Even if bubbles form in the fused section, sealing characteristics do not deteriorate and no leakage occurs because the fused section does not act as a contacting section with the sealing member.

The sealing structure in accordance with the present invention may be used for, for example, a vacuum apparatus, an internal combustion engine and other sealing apparatuses. A vacuum apparatus using the present invention can achieve a higher degree of vacuum than conventional apparatuses. An internal combustion engine using the present invention can achieve a higher compression ratio and a higher output than conventional engines.

A preferable division member material is an aluminum alloy, and particularly an Al—Mg based alloy having excellent corrosion resistance and plasma resistance. Examples of preferable Al—Mg based alloys include JIS A5052, MX534 (trademark: Mitsubishi Material Corporation), and MX533 (trademark: Mitsubishi Material Corporation). Since these Al—Mg based alloys are light and have excellent corrosion resistance and plasma resistance, they are preferably used in chamber members (division members) for vacuum apparatuses, especially various plasma application systems. The Al—Mg based alloys evidently demonstrate advantages in the present invention due to Hv values of approximately 60 to 70.

Examples of alloys suitable for use such as in internal combustion engines which require high thermal durability and mechanical strength include Al—Cu based alloys, Al—Cu—Zn based alloys, Al—Cu—Zn—Mg based alloys, and Al—Mg—Fe based alloys.

Various materials having a higher hardness than a division member may be used as a seat member in accordance with the present invention. Materials having a Hv value of 100 or more are preferably used. Among them, aluminum alloys are more preferably used in view of reduced weight. Examples of aluminum alloys include precipitation hardening alloys, such as Al—Cu based alloys, e.g. JIS A2219 and JIS A2017; and Al—Mg—Si based alloys, e.g. JIS A6061. When an Al—Cu based alloy or Al—Si—Mg based alloy, which is light and has a Hv value of 100 or more, is used for the seat member, the sealing apparatus exhibits excellent sealing characteristics. A preferable combination is JIS A5052 for the division member and JIS A2219 for the seat member in view of weldability.

When an Al—Cu based alloy having high mechanical strength is used as a division member material, an alloy having a higher hardness other than the aluminum alloy may be used as the seat member. If the same material as the division member material is used for the seat member in view of weldability, it is preferable that the hardness of the seat member be raised by enhancing precipitation hardening of the seat member compared to the division member material.

Examples of other preferable alloys for the seat member include Cu alloys and Ni alloys.

In the present invention, the seat member is locally fused to the division member material at the side face of the seating section. Such local fusion is preferably performed by electron beam welding. Electron beam welding can weld the division member and the seat member with a minimized heat affected zone. For example, when a precipitation hardening Al—Cu alloy such as JIS A2219 is used as the seat member, the alloy hardness will decrease due to dissolution of precipitants which occurs due to heat during conventional welding, and a dent may form during repeated use. Electron beam welding can prevent such a decrease in hardness.

BRIEF DESCRIPTION OF THE DRAWINGS

FIG. 1A through 1D are cross-sectional views illustrating production steps of a division member in accordance with the present invention;

DESCRIPTION OF THE PREFERRED EMBODIMENTS

A fusing process in accordance with the present invention will be described with reference to FIGS. 1A–1D groove 8 (FIG. 1B) is provided on a seating section of a division member 6 (FIG. 1A) for a sealing member and a seat member 11 is embedded into the groove 8 (FIG. 1C). Then, the division member 6 is locally fused to the seat member 11 at the side face of the groove 8 by, for example, electron beam irradiation to form a fused section 12.

Since no sinking occurs during cooling after fusion, flatness can be maintained. Therefore, no planarization process is required. Of course, planarization may be employed to finish the weld section into a finer surface.

EXAMPLES

Al—Cu Alloy Sample 1

Figure 2A:
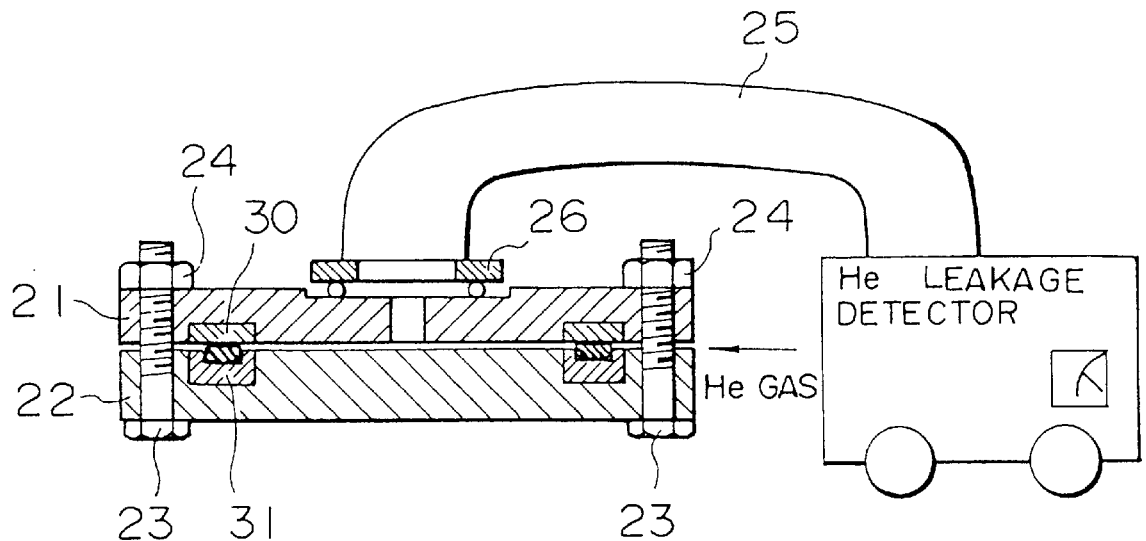
FIG. 2A is a cross-sectional view illustrating an apparatus to measure sealing characteristics of a division member.
Figure 2B:
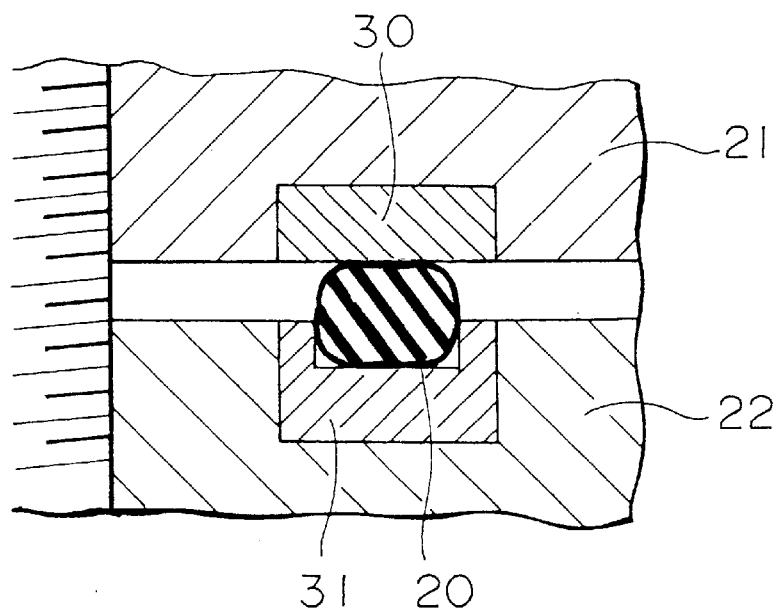
FIG. 2B is an enlarged cross-sectional view of a seating section of the division member for a sealing member.

Al—Cu Alloy Sample 1 will be described with reference to FIG. 2. FIG. 2A is a cross-sectional view illustrating an apparatus to measure sealing characteristics of a division member, and FIG. 2B is an enlarged cross-sectional view of a seating section of the division member for a sealing member.

In this example, a grooved flange 22 and a non-grooved flange 21 each having a thickness of 15 mm and an outer diameter of 105 mm were prepared. These flanges were made of a H112 treated JIS A5052 material. The non-grooved flange 21 was provided with a groove having a depth of 5 mm and a width of 15 mm at the seating section of an O-ring as a sealing member, and a seat member 30 with a thickness 5 mm and a width of 15 mm composed of a T851 treated JIS A2219 Al—Cu alloy was embedded into the groove. The side face of the flange 21 was fused to the seat member 30 by electron beam welding under the following conditions:

Degree of vacuum: $10^{-4}$ Torr

Accelerated voltage: 120 KeV

Electron current: 50 mA

Beam diameter: 1 mm

Beam scanning speed: 1 cm/sec

Welded depth: 15 to 20 mm

On the other hand, a seat member 31 having a thickness of 8 mm and a width of 15 mm was embedded into the groove of the grooved flange 22. The seat member 31 had a groove of 3 mm depth and 10 mm width, and was made of a JIS A2219 (T851) Al—Cu alloy. The seat member 31 was locally fused to the side face of the groove of the flange under the same conditions as above.

The pair of flanges 21 and 22 was subjected to the following leakage measurement using a leakage detector set forth in FIG. 2A.

(1) Flanges 22 and 21 were in contact with each other through an O-ring 20 and sealed by clamping with an aluminum alloy-bolt 23 and an aluminum alloy nut 24 with a clamping torque of 170 kgf-cm. The O-ring used was a U-TIGHTSEAL (trademark: Usui Kokusai Sangyo Kaisya, Ltd.).

(2) The flange 21 was connected to a He leakage detector through a NW40 (ISO Standard) flange 26 and a flexible hose 25.

(3) A space formed by the flange 21 and the flange 22 was evacuated to $10^{-6}$ mbar while monitoring the He leakage detector.

(4) The leakage rate was measured with the He leakage detector while injecting gaseous helium outside the flanges.

(5) The O-ring 20 was exchanged for a new one, and the above steps (1) through (4) were repeated. Each leakage rate was measured for every O-ring attachment. Results are shown as mark ○ in FIG. 3.

[TiN Film Coating Sample]

A conventional TiN film coating material set forth above having a thickness of 50 μm was evaluated by procedure. The flange couple as used here were formed in the same size as those using the above Al—Cu Alloy Sample 1 used. The results are shown as mark ● in FIG. 3.

Figure 3:
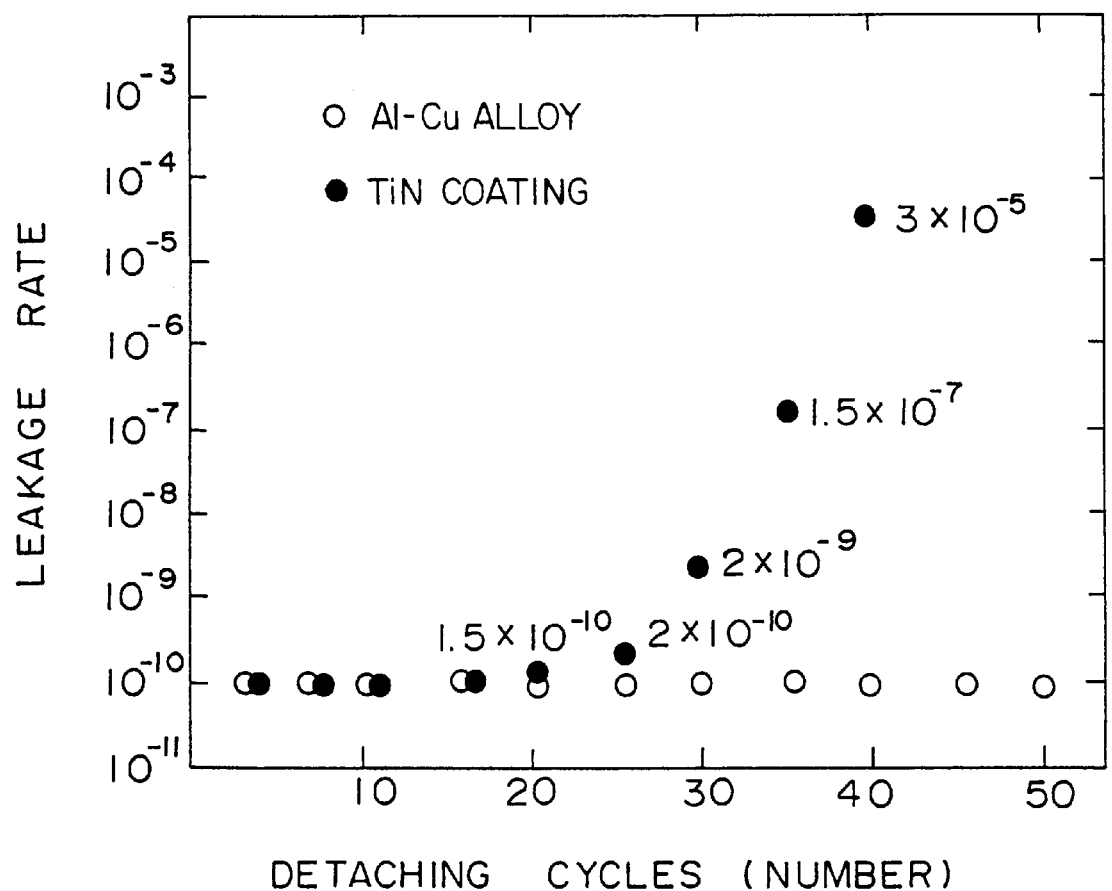
FIG. 3 is a graph illustrating leakage rate comparison between a sealing structure with a seat member made of an Al—Cu alloy and a sealing structure with an O-ring coated with a conventional TiN film.

FIG. 3 demonstrates that the sealing section made of the above Al—Cu Alloy Sample 1 has an extremely low leakage rate of $10^{-10}$ atm-cc/sec even after 50 repeated cycles, whereas the sealing section made of the above TiN Film Coating Sample exhibits an increased leakage rate after 20 repeated cycles.

[Al—Cu Alloy Sample 2]

Five pairs of flanges each using the above Al—Cu Alloy Sample 1 were prepared. These flange couples were subjected to leakage rate measurement according to the steps (1) through (4) set forth above. Average, maximum and minimum leakage rates were determined from these flange couples. Results are shown in FIG. 4, wherein mark ○ represents the average of Al—Cu Alloy Sample 2.

[Al—Ni Weld Section]

Five pairs of flanges each having an Al—Ni weld section set forth in FIG. 7A–7E were prepared. A groove was provided on the weld section of each grooved flange set forth in FIG. 7D by cutting. The leakage rates were determined by using the same method as used with the above Al—Cu Alloy Sample 2. Results are shown in FIG. 4, wherein mark ● represents the average of a sealing structure with the Al—Ni weld section.

Figure 4:
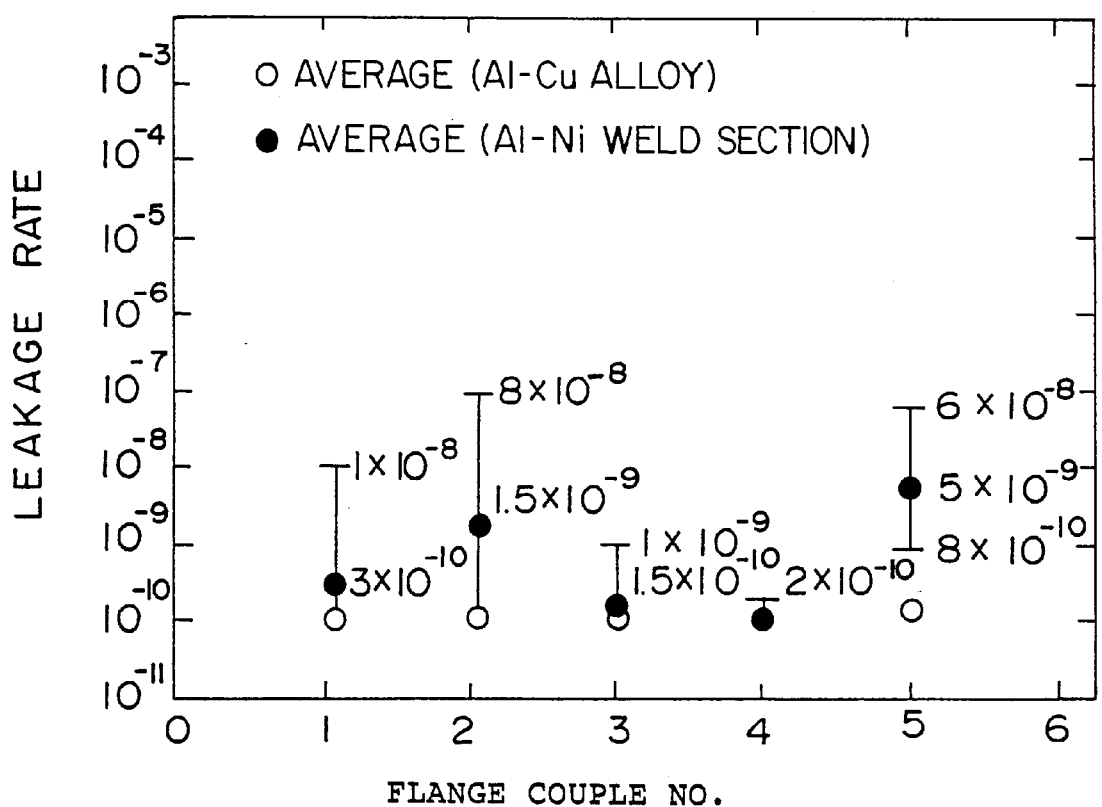
FIG. 4 is a graph illustrating leakage rate comparison between a sealing structure with a seat member made of an Al—Cu alloy and a sealing structure with a conventional Al—Ni weld section.

FIG. 4 shows that all the flange couples using the above Al—Cu Alloy Sample 2 show leakage rates of $10^{-10}$ atm-cc/sec. Further, each flange couple has the same minimum and maximum leakage rate, indicating no fluctuation. In contrast, for the sealing structure with the Al—Ni weld section, the leakage rate drastically varies between different flange couples, that is, $10^{-10}$ atm-cc/sec in flange couple No. 4 and $6 \times 10^{-8}$ atm-cc/sec in flange couple No. 5. Further, in each flange couple having the sealing structure with the Al—Ni weld section, there is a great difference between the maximum and minimum.

[Vacuum Apparatus]

Figure 5:
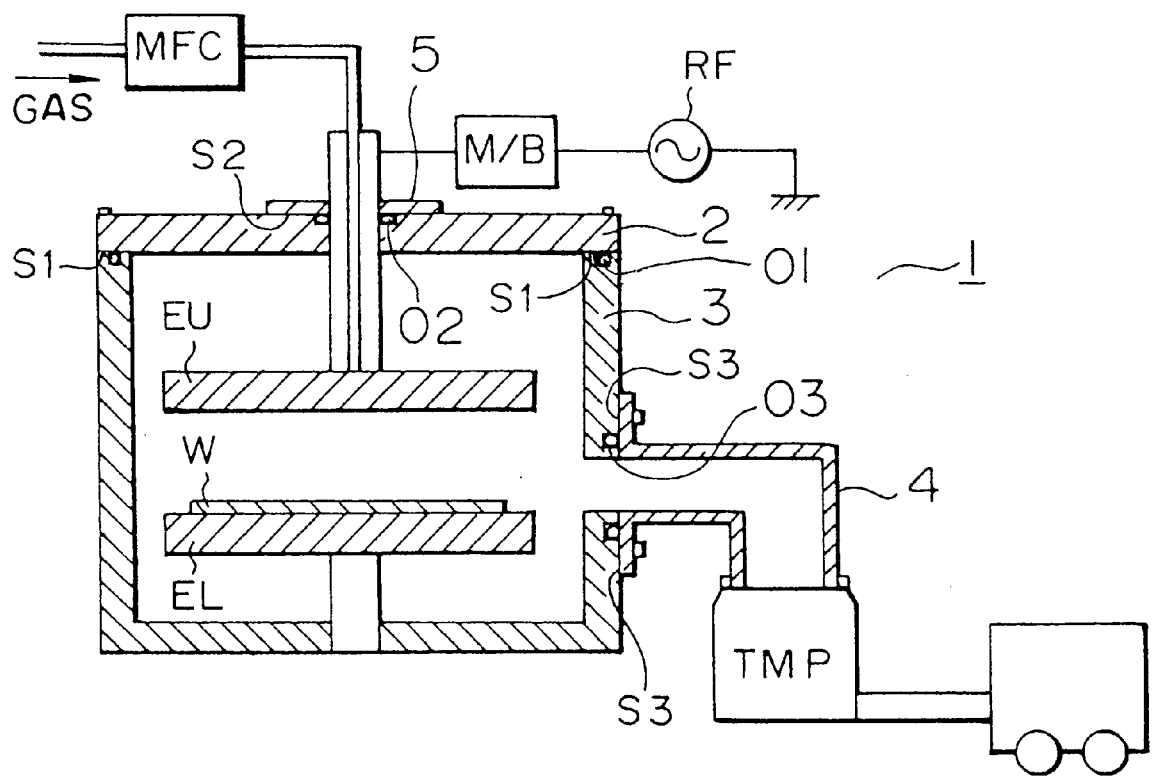
FIG. 5 is a cross-sectional view of a vacuum apparatus in accordance with the present invention.

The present invention was applied to a vacuum apparatus set forth in FIG. 5.

The vacuum apparatus 1 is provided with a cover member 2, a housing member 3, a vacuum system member 4, and a flange 5, all these members were composed of an Al—Mg based alloy.

Second members were embedded onto seating sections of sealing section S1, S2 and S3 for O-rings O1, O2 and O3. These seat members were composed of an T851 treated JIS A2219 alloy, and each seat member was locally fused to the side face of its respective seating section of the vacuum apparatus 1.

The vacuum apparatus 1 assembled in such a manner exhibited a lower leakage rate than those of conventional vacuum apparatuses and was capable of high vacuum evacuation. An aluminum film with slight hillocks was formed from this vacuum apparatus 1.

[Internal Combustion Engine]

Figure 6:
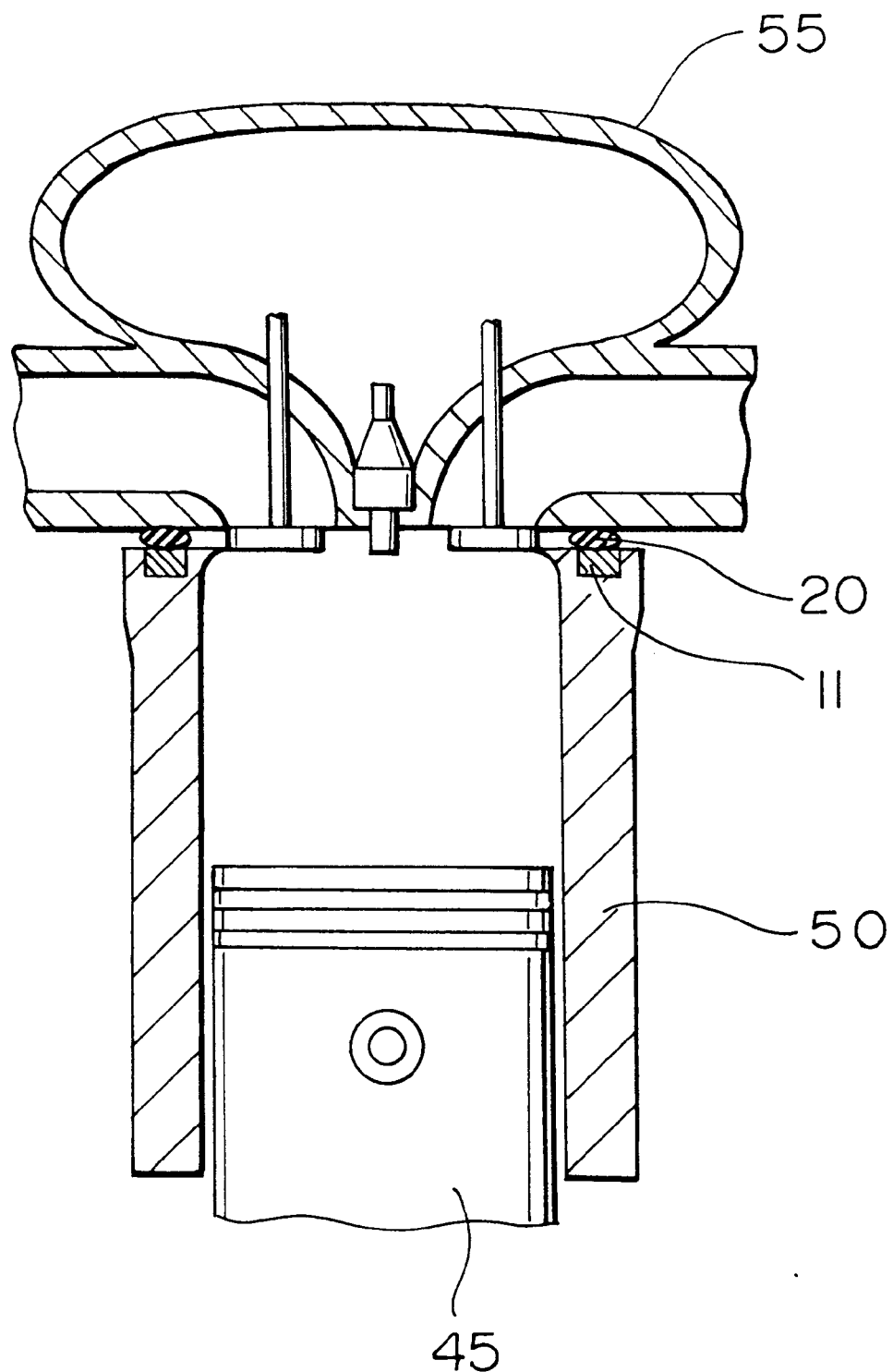
FIG. 6 is a cross-sectional view of an internal combustion engine in accordance with the present invention.
Figure 7A:
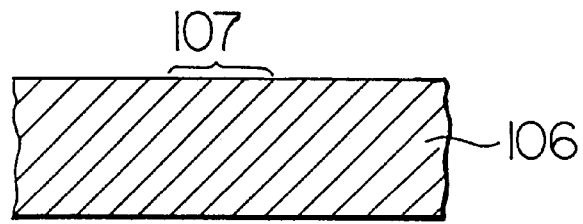
FIGS. 7A through 7E are cross-sectional views illustrating production steps of a conventional division member.
Figure 7B:
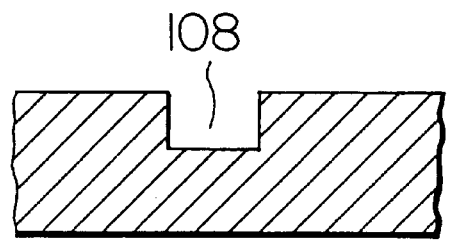
Figure 7C:
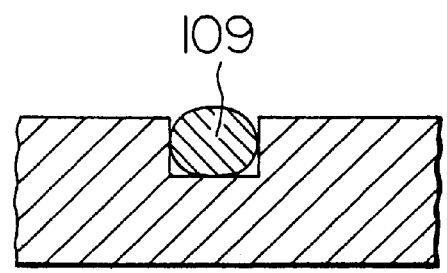
Figure 7D:
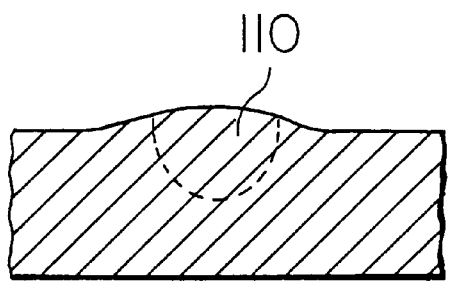
Figure 7E:
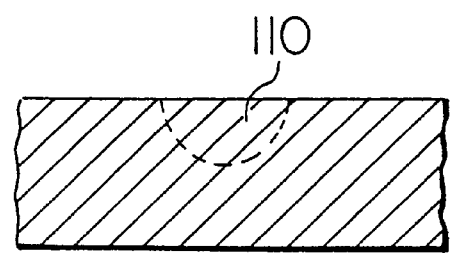

FIG. 6 is a cross-sectional view illustrating an internal combustion engine as an application of the sealing apparatus in accordance with the present invention. In the internal combustion engine, a cylinder 50 and a cylinder head 55 comprise a division member, and a seat member 11 is embedded into a seating section of the cylinder 50 for a sealing member 20. In FIG. 6, numeral 45 represents a piston.

An Al—Cu based alloy is used as the base material of the cylinder 50 and a stainless steel alloy is used for the seat member. The cylinder 50 with the embedded seat member 11 and the cylinder head 55 were sealed through the sealing member 20 to assemble the internal combustion engine.

On the other hand, a comparative internal combustion engine was assembled by sealing a cylinder without an embedded seat member to a cylinder head through a sealing member.

The internal combustion engine in accordance with the present invention exhibits a higher output power than that of the comparative example.

As set forth above, a sealing apparatus in accordance with the present invention exhibits excellent sealing characteristics after repeated use with little fluctuation.

What is claimed is:

1. A sealing structure for an airtight chamber comprising:

(a) a first division member and a second division member being repeatedly joined and disjoined, wherein said first and second chamber members are joined together to define said chamber between them and disjoined to allow access to said chamber;

(b) a sealing member pressed between said first and second division members to keep said chamber airtight against a pressure difference between the exterior and the interior of said chamber while said first and second division members are joined, at least one of said first and second division members being made of a material with hardness lower than that of said sealing member, said division member whose hardness is lower than that of said sealing member being formed with a groove; and (c) a seat member being embedded in said groove and pressed against said sealing member while said first and second division members are joined, said seat member being made of a material harder than said division member having said groove and welded in said groove only along its contacting surfaces with said groove.

2. A sealing structure for an airtight chamber according to claim 1, wherein said chamber is a vacuum chamber.

3. A sealing structure for an airtight chamber according to claim 1, wherein said division member whose hardness is lower than that of said sealing member is made of an aluminum alloy.

4. A sealing structure for an airtight chamber according to claim 3, wherein said aluminum alloy is an Al—Mg based alloy whose Hv value is between about 60 and about 70.

5. A sealing structure for an airtight chamber according to claim 4, wherein said seat member has a Hv value of 100 or more.

6. A sealing structure for an airtight chamber according to claim 5, wherein said seat member is made of an Al—Cu based alloy.

7. A sealing structure for an airtight chamber according to claim 6, wherein said seat member is made of an Al—Si—Mg based alloy.

8. A sealing structure for an airtight chamber according to claim 1, wherein said groove has a rectangular cross-section, and said seat member is welded in said groove along the side surfaces of said groove.

9. A sealing structure for an airtight chamber according to claim 1, wherein said seat member is welded in said groove by electron beam welding.

* * * * *